United States Patent
Kim et al.

(10) Patent No.: US 12,495,538 B2
(45) Date of Patent: Dec. 9, 2025

(54) SEMICONDUCTOR APPARATUS

(71) Applicant: SAMSUNG ELECTRONICS CO., LTD., Suwon-si (KR)

(72) Inventors: Teawon Kim, Hwaseong-si (KR); Jiwon Yun, Hwaseong-si (KR); Yurim Kim, Suwon-si (KR); Junghan Lee, Seongnam-si (KR); Yongsuk Tak, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 499 days.

(21) Appl. No.: 18/103,596

(22) Filed: Jan. 31, 2023

(65) Prior Publication Data

US 2023/0255017 A1    Aug. 10, 2023

(30) Foreign Application Priority Data

Feb. 9, 2022    (KR) .................. 10-2022-0016976

(51) Int. Cl.
*H10B 12/00* (2023.01)
(52) U.S. Cl.
CPC ....... *H10B 12/315* (2023.02); *H10B 12/0335* (2023.02); *H10B 12/05* (2023.02); *H10B 12/482* (2023.02)
(58) Field of Classification Search
CPC .... H10B 12/315; H10B 12/482; H10B 12/05; H10B 12/0335; H10D 30/6728; H10D 30/6755
See application file for complete search history.

(56) References Cited

U.S. PATENT DOCUMENTS

| | | | |
|---|---|---|---|
| 8,304,824 B2 * | 11/2012 | Kim | H10B 12/482 257/302 |
| 8,390,062 B2 | 3/2013 | Kobayashi et al. | |
| 10,367,066 B2 | 7/2019 | Shi | |
| 10,790,396 B2 | 9/2020 | Sawabe et al. | |
| 11,647,625 B2 | 5/2023 | Hong et al. | |

(Continued)

FOREIGN PATENT DOCUMENTS

| | | |
|---|---|---|
| TW | 2011-33798 A | 10/2011 |
| TW | 2012-05757 A | 2/2012 |

(Continued)

OTHER PUBLICATIONS

First Office Action issued Nov. 8, 2023 for corresponding TW Patent Application No. 112104246.

*Primary Examiner* — Steven M Page
(74) *Attorney, Agent, or Firm* — Muir Patent Law, PLLC

(57) ABSTRACT

A semiconductor apparatus includes a bit line extending in a first horizontal direction on a substrate; a channel layer on the bit line, the channel layer extending in a vertical direction, including a first oxide semiconductor material that includes indium, and having a first side wall and a second side wall; a word line on the first side wall of the channel layer; a contact forming region on a top surface and an upper portion of the second side wall of the channel layer, the contact forming region including a second oxide semiconductor material that includes indium and having a resistivity lower than a resistivity of the channel layer; a contact layer on the contact forming region; and a capacitor structure on a top surface of the contact layer.

20 Claims, 21 Drawing Sheets

(56) References Cited

U.S. PATENT DOCUMENTS

| | | | |
|---|---|---|---|
| 2011/0068384 A1* | 3/2011 | Kim | H10B 12/482 257/302 |
| 2020/0006572 A1 | 1/2020 | Sharma et al. | |
| 2020/0006575 A1 | 1/2020 | Dewey et al. | |
| 2020/0111908 A1 | 4/2020 | Sills et al. | |
| 2020/0286905 A1 | 9/2020 | Kai et al. | |
| 2021/0013210 A1 | 1/2021 | Lee et al. | |
| 2021/0296345 A1 | 9/2021 | Wang et al. | |
| 2021/0408117 A1 | 12/2021 | Wu et al. | |
| 2023/0255017 A1* | 8/2023 | Kim | H10B 12/482 257/43 |

FOREIGN PATENT DOCUMENTS

| | | |
|---|---|---|
| TW | 2021-37518 A | 10/2021 |
| TW | 2022-01822 A | 1/2022 |
| TW | 2022-05540 A | 2/2022 |
| WO | WO 2019/005090 A1 | 1/2019 |

* cited by examiner

A1 – A1'

A1 - A1'

A1 - A1'

A1-A1'

SEMICONDUCTOR APPARATUS

CROSS-REFERENCE TO RELATED APPLICATION

This application is based on and claims priority under 35 U.S.C. § 119 to Korean Patent Application No. 10-2022-0016976, filed on Feb. 9, 2022, in the Korean Intellectual Property Office, the disclosure of which is incorporated by reference herein in its entirety.

BACKGROUND

1. Field

Embodiments relate to a semiconductor apparatus.

2. Description of the Related Art

As semiconductor apparatuses have been downscaled, sizes of dynamic random-access memory (DRAM) devices have also been reduced.

SUMMARY

The embodiments may be realized by providing a semiconductor apparatus including a bit line extending in a first horizontal direction on a substrate; a channel layer on the bit line, the channel layer extending in a vertical direction, including a first oxide semiconductor material that includes indium, and having a first side wall and a second side wall; a word line on the first side wall of the channel layer; a contact forming region on a top surface and an upper portion of the second side wall of the channel layer, the contact forming region including a second oxide semiconductor material that includes indium and having a resistivity lower than a resistivity of the channel layer; a contact layer on the contact forming region; and a capacitor structure on a top surface of the contact layer.

The embodiments may be realized by providing a semiconductor apparatus including a bit line extending in a first horizontal direction on a substrate; a channel layer on the bit line, the channel layer extending in a vertical direction, including a first oxide semiconductor material that includes indium, and having a first side wall and a second side wall; a word line on the first side wall of the channel layer; a contact forming region on a top surface of the channel layer, the contact forming region including a second oxide semiconductor material that includes indium; a contact layer on the contact forming region; and a capacitor structure on the contact layer, wherein the channel layer has a first indium content, and the contact forming region has a second indium content greater than the first indium content.

The embodiments may be realized by providing a semiconductor apparatus including a bit line extending in a first horizontal direction on a substrate; a mold layer covering the bit line on the substrate, the mold layer including a mold opening; a channel layer on an inner wall of the mold opening, the channel layer extending in the first horizontal direction, including a first portion contacting a top surface of the bit line and a second portion extending in a vertical direction on the inner wall of the mold opening, and including a first oxide semiconductor material that includes indium; a word line in the mold opening, the word line being on a first side wall of the second portion of the channel layer; a contact forming region covering the channel layer, the contact forming region including a second oxide semiconductor material that includes indium and including a horizontal extending portion located on a top surface of the channel layer and a vertical extending portion located on an upper portion of a second side wall opposite to the first side wall of the second portion of the channel layer; a contact layer covering the contact forming region; and a capacitor structure on the contact layer, wherein the channel layer has a first indium content, and the contact forming region has a second indium content greater than the first indium content.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
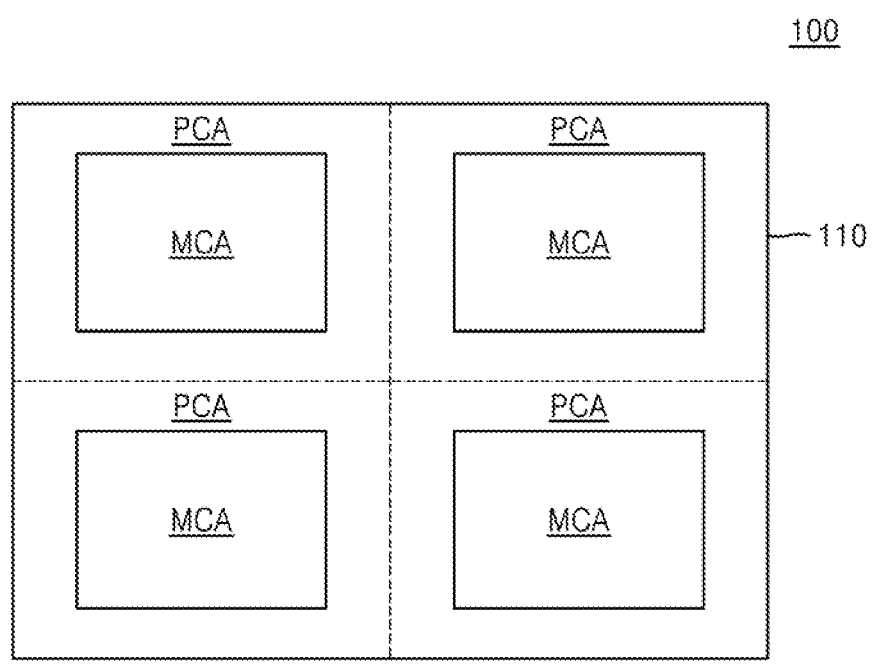
FIG. 1 is a layout view of a semiconductor apparatus, according to embodiments.
Figure 2:
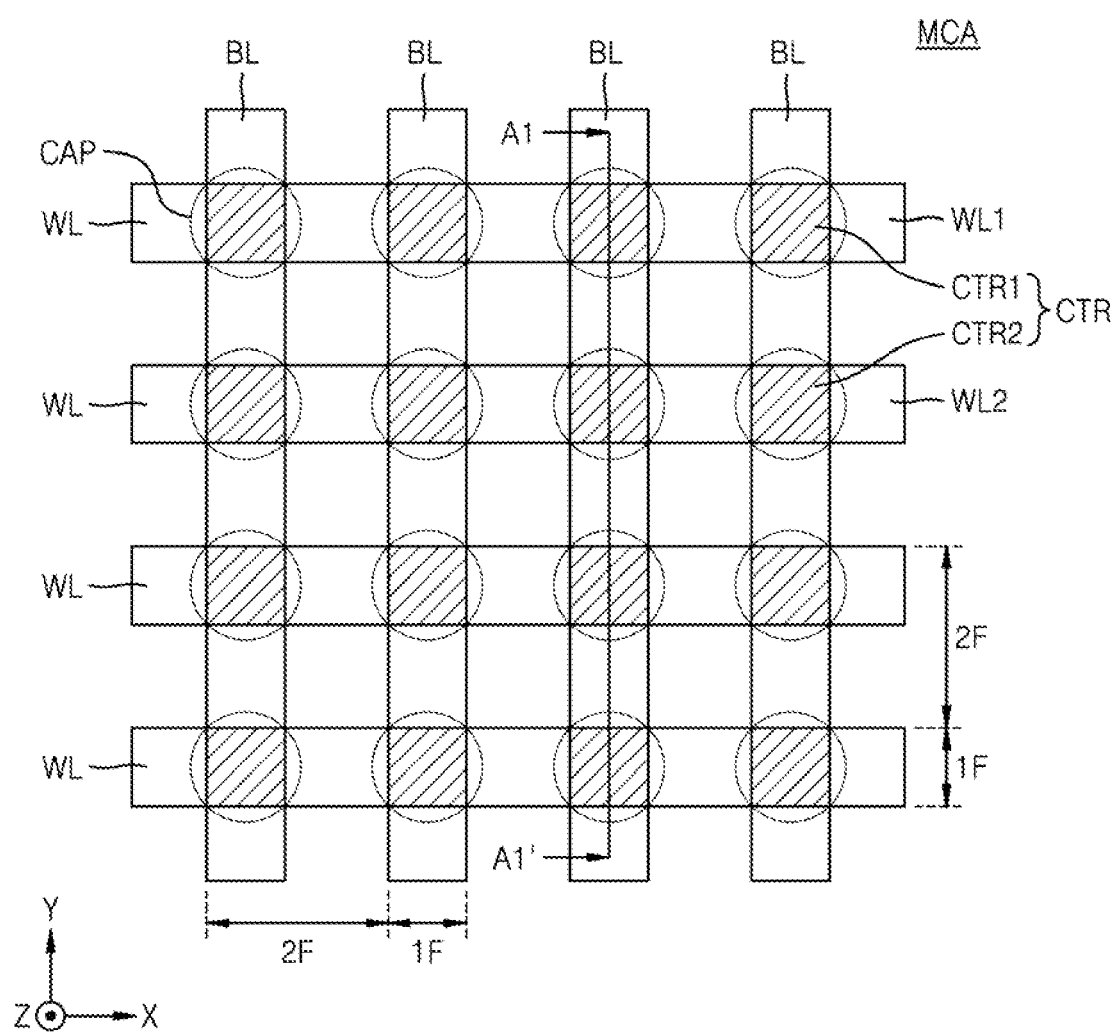
FIG. 2 is an enlarged layout view of a cell array area of FIG. 1.
Figure 3:
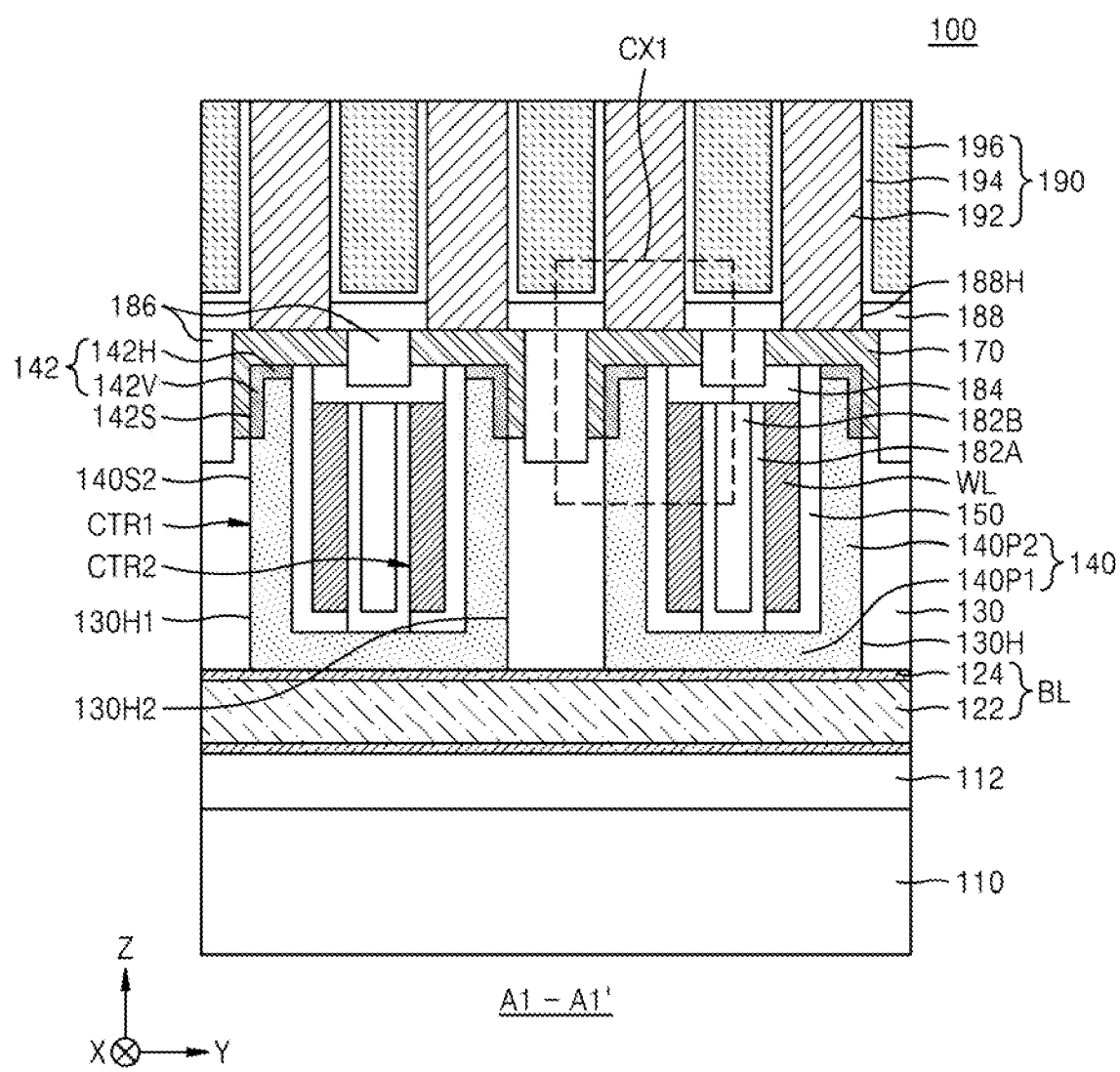
FIG. 3 is a cross-sectional view taken along line A1-A1' of FIG. 2.
Figure 4:
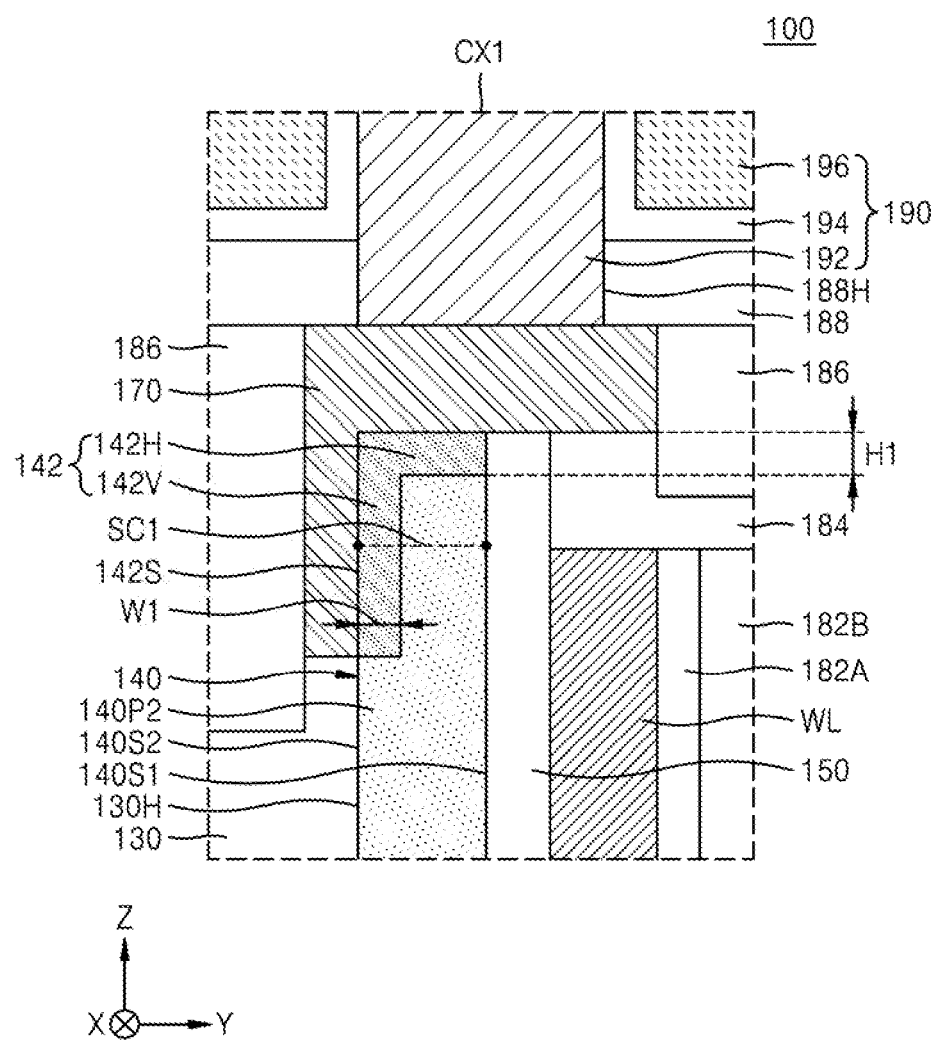
FIG. 4 is an enlarged view of a portion CX1 of FIG. 3.
Figure 5A:
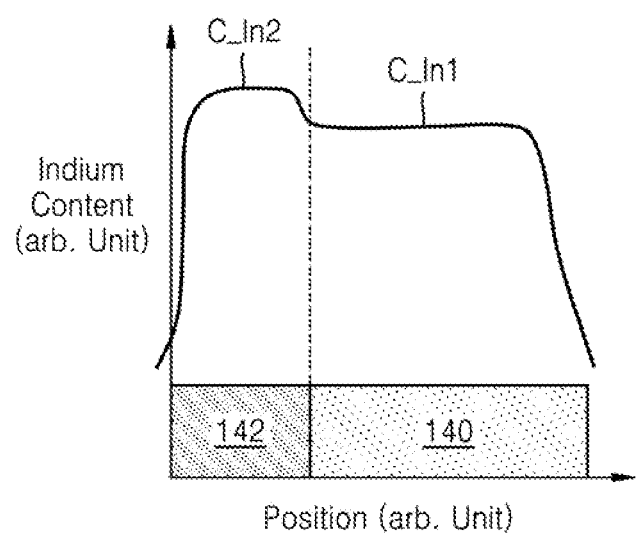
FIG. 5A is a graph showing an indium content along a scan line SC1 of FIG. 4.
Figure 5B:
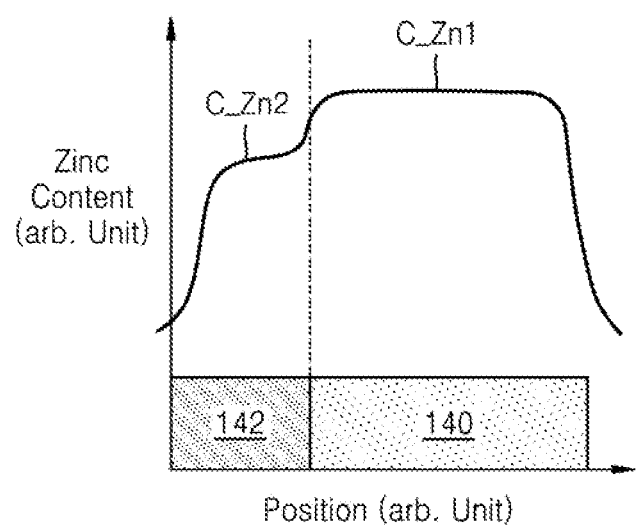
FIG. 5B is a graph showing a zinc content along the scan line SC1 of FIG. 4.

FIG. 1 is a layout view of a semiconductor apparatus 100, according to embodiments. FIG. 2 is an enlarged layout view of a cell array area MCA of FIG. 1. FIG. 3 is a cross-sectional view taken along line A1-A1' of FIG. 2. FIG. 4 is an enlarged view of a portion CX1 of FIG. 3. FIG. 5A is a graph showing an indium content along a scan line SC1 of FIG. 4. FIG. 5B is a graph showing a zinc content along the scan line SC1 of FIG. 4.

Referring to FIGS. 1 through 5B, the semiconductor apparatus 100 may include a substrate 110 including the cell array area MCA and a peripheral circuit area PCA. In an implementation, the cell array area MCA may be a memory cell area of a dynamic random-access memory (DRAM) device, and the peripheral circuit area PCA may be a core area or a peripheral circuit area of the DRAM device. In an implementation, the peripheral circuit area PCA may include a peripheral circuit transistor for transmitting a signal and/or power to a memory cell array included in the cell array area MCA. In an implementation, the peripheral circuit transistor may constitute various circuits such as a command decoder, a control logic, an address buffer, a row decoder, a column decoder, a sense amplifier, or a data input/output circuit.

As shown in FIG. 2, on the cell array area MCA of the substrate 110, a plurality of word lines WL extending in a first horizontal direction X and a plurality of bit lines BL extending in a second horizontal direction Y may be arranged. A plurality of cell transistors CTR may be at intersections between the plurality of word lines WL and the plurality of bit lines BL. A plurality of cell capacitors CAP may be respectively on the plurality of cell transistors CTR.

The plurality of word lines WL may include a first word line WL1 and a second word line WL2 alternately arranged in the second horizontal direction Y, and the plurality of cell transistors CTR may include a first cell transistor CTR1 and a second cell transistor CTR2 alternately arranged in the second horizontal direction Y. The first cell transistor CTR1 may be located on the first word line WL1, and the second cell transistor CTR2 may be located on the second word line WL2.

The first cell transistor CTR1 and the second cell transistor CTR2 may be mirror symmetric to each other. In an implementation, the first cell transistor CTR1 and the second cell transistor CTR2 may be mirror symmetric about a central line between the first cell transistor CTR1 and the second cell transistor CTR2 extending in the first horizontal direction X.

In an implementation, a width of each of the plurality of word lines WL may be 1F, a pitch of the plurality of word lines WL (e.g., a sum of a width and an interval) may be 2F, a width of each of the plurality of bit lines BL may be 1F, a pitch of the plurality of bit lines BL (i.e., a sum of a width and an interval) may be 2F, and a unit area for forming one cell transistor CTR may be $4F^2$. In an implementation, the cell transistor CTR may have a cross-point type requiring a relatively small unit area, and the semiconductor apparatus 100 may be highly integrated.

As shown in FIG. 3, a lower insulating layer 112 may be on the substrate 110. The substrate 110 may include silicon, e.g., single crystalline silicon, polycrystalline silicon, or amorphous silicon. In an implementation, the substrate 110 may include, e.g., Ge, SiGe, SiC, GaAs, InAs, or InP. In some embodiments, the substrate 110 may include a conductive region, e.g., a well doped with impurities or a structure doped with impurities. The lower insulating layer 112 may include an oxide film, a nitride film, or a combination thereof. As used herein, the term "or" is not an exclusive term, e.g., "A or B" would include A, B, or A and B.

The bit line BL extending in the second horizontal direction Y may be on the lower insulating layer 112. In an implementation, the bit line BL may include, e.g., Ti, TiN, Ta, TaN, W, WN, TiSiN, WSiN, polysilicon, or a combination thereof. In an implementation, the bit line BL may include a conductive layer 122, and conductive barrier layers 124 on a top surface and a bottom surface of the conductive layer 122. A bit line insulating layer extending in the second horizontal direction Y may be on a side wall of the bit line BL. In an implementation, the bit line insulating layer may fill a space between two adjacent bit lines BL and may be at the same height (e.g., distance from the substrate 110 in the vertical Z direction) as the bit line BL.

A mold layer 130 may be on the bit line BL and the bit line insulating layer. The mold layer 130 may include a plurality of mold openings 130H. The plurality of mold openings 130H may include a first side wall 130H1 and a second side wall 130H2 opposite to each other. A top surface of the bit line BL may be exposed at the bottom of each of the plurality of mold openings 130H. The mold layer 130 may include silicon oxide, silicon nitride, or silicon oxynitride.

A plurality of channel layers 140 may be on inner walls of the plurality of mold openings 130H. Each of the plurality of channel layers 140 may include a first portion 140P1 extending (e.g., lengthwise) in the second horizontal direction Y from the bottom of each of the plurality of mold openings 130H, and a second portion 140P2 connected to the first portion 140P1 and on the first side wall 130H1 and the second side wall 130H2 of each of the plurality of mold openings 130H. In an implementation, each of the plurality of channel layers 140 may have a roughly U-shaped vertical cross-section. The second portion 140P2 of each of the plurality of channel layers 140 may include a first side wall 140S1 and a second side wall 140S2 opposite to each other, and the second side wall 140S2 may contact the mold layer 130. Each of the plurality of channel layers 140 may have a top surface at a higher level than a top surface of the mold layer 130, and an upper portion of the second side wall 140S2 may not be surrounded by the mold layer 130.

In an implementation, the plurality of channel layers 140 may include a first oxide semiconductor material. In an implementation, the first oxide semiconductor material may include indium. In an implementation, the first oxide semiconductor material may include, e.g., $InGaZnO_x$ (IGZO), Sn-doped IGZO, W-doped IGZO, or $InZnO_x$ (IZO).

A gate insulating layer 150 and the word line WL may be sequentially on the first side wall 140S1 of each of the plurality of channel layers 140. In an implementation, the gate insulating layer 150 may be conformally on a top surface of the first portion 140P1 and the first side wall 140S1 of the second portion 140P2 of each of the plurality of channel layers 140. The word line WL may be on the top surface of the first portion 140P1 and the first side wall 140S1 of each of the plurality of channel layers 140, and the gate insulating layer 150 may be between the word line WL and the channel layer 140.

In an implementation, the channel layer 140 having the U-shaped vertical cross-section may be in one mold opening 130H, and two word lines WL may be spaced apart from each other on the channel layer 140 in the one mold opening 130H. One word line WL may face one second portion 140P2 of the channel layer 140, and the other word line WL may face the other second portion 140P2 of the channel layer 140. One word line WL, one second portion 140P2 of the channel layer 140, and the gate insulating layer 150 therebetween may constitute the first cell transistor CTR1, and the other word line WL, the other second portion 140P2 of the channel layer 140, and the gate insulating layer 150 therebetween may constitute the second cell transistor CTR2. In an implementation, the first cell transistor CTR1 and the second cell transistor CTR2 may be mirror symmetrically arranged to each other in one mold opening 130H.

In an implementation, the gate insulating layer 150 may be formed of, e.g., a high-k dielectric material having a higher dielectric constant than that of silicon oxide or a ferroelectric material. In an implementation, the gate insulating layer 150 may be formed of, e.g., hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), or lead scandium tantalum oxide (PbScTaO).

In an implementation, the word line WL may include, e.g., Ti, TiN, Ta, TaN, W, WN, TiSiN, WSiN, polysilicon, or a combination thereof.

A contact forming region 142 may be on the top surface of each of the plurality of channel layers 140 and the upper portion of the second side wall 140S2. The contact forming region 142 may include a second oxide semiconductor material. In an implementation, the second oxide semiconductor material may include indium. In an implementation, the second oxide semiconductor material may include, e.g., IGZO, Sn-doped IGZO, W-doped IGZO, or IZO. In an implementation, the contact forming region 142 (e.g., the second oxide semiconductor material) may have a resistivity lower than a resistivity of the channel layer 140 (e.g., a resistivity of the first oxide semiconductor material).

In an implementation, the contact forming region 142 may include a horizontal extending portion 142H on the top surface of the channel layer 140, and a vertical extending portion 142V on the upper portion of the second side wall 140S2 of the channel layer 140. The horizontal extending portion 142H may be connected to an upper end of the vertical extending portion 142V, so that the contact forming region 142 has an inverted L-shaped vertical cross-section.

In an implementation, the contact forming region 142 may be formed by performing surface treatment on the top surface of the channel layer 140 and an exposed surface of the second side wall 140S2. Due to the surface treatment, some atoms (e.g., zinc atoms) may be removed from a portion having a certain depth from the top surface of the channel layer 140 and the second side wall 140S2, and the contact forming region 142 may include the second oxide semiconductor material having an atomic ratio or stoichiometry different from that of the first oxide semiconductor material of the channel layer 140.

In an implementation, the channel layer 140 may include indium gallium zinc oxide, and may have a first indium content $C\_In1$ and a first zinc content $C\_Zn1$. The contact forming region 142 may include indium gallium zinc oxide, and may have a second indium content $C\_In2$ and a second zinc content $C\_Zn2$. The second indium content $C\_In2$ may be different from the first indium content $C\_In1$, and the second zinc content $C\_Zn2$ may be different from the first zinc content $C\_Zn1$.

As shown in FIG. 5A, the channel layer 140 may have the first indium content $C\_In1$, and the contact forming region 142 may have the second indium content $C\_In2$ greater than the first indium content $C\_In1$. As shown in FIG. 5B, the channel layer 140 may have the first zinc content $C\_Zn1$, and the contact forming region 142 may have the second zinc content $C\_Zn2$ less than the first zinc content $C\_Zn1$. In an implementation, the contact forming region 142 may be an indium-rich region, when compared to the channel layer 140.

A indium content and a zinc content in the channel layer 140 and the contact forming region 142 measured along the scan line SC1 are schematically shown in FIGS. 5A and 5B. In an implementation, relative sizes or scales of the indium content and the zinc content may vary. An indium content and a zinc content may be measured by using analytical equipment capable of elemental analysis such as energy dispersive X-ray spectroscopy (EDX).

In an oxide semiconductor material including indium, gallium, and zinc, carrier mobility may increase as an indium content increases. In an implementation, the contact forming region 142 may have the second indium content $C\_In2$ greater than the first indium content $C\_In1$ of the channel layer 140, and the contact forming region 142 may have improved carrier mobility and reduced contact resistance.

In an implementation, the vertical extending portion 142V and the horizontal extending portion 142H of the contact forming region 142 may be at a higher vertical level than the top surface of the mold layer 130. In an implementation, a side wall 142S of the vertical extending portion 142V may be aligned with the second side wall 140S2 of the channel layer 140 (e.g., the side wall 142S of the vertical extending portion 142V may be coplanar with the lower portion of the second side wall 140S2 of the channel layer 140), and the side wall 142S of the vertical extending portion 142V may not be surrounded by the mold layer 130 and may not contact the mold layer 130.

The horizontal extending portion 142H of the contact forming region 142 may have a first height H1 in the vertical direction Z, and the vertical extending portion 142V of the contact forming region 142 may have a first width W1 in the second horizontal direction Y. In an implementation, each of the first height H1 and the first width W1 may range from, e.g., about 1 angstrom to about 20 angstroms (Å). In an implementation, the first height H1 may range from, e.g., about 80% to about 120% of the first width W1.

A contact layer 170 may be on the contact forming region 142. The contact layer 170 may extend to the mold layer 130 while covering the vertical extending portion 142V and the horizontal extending portion 142H of the contact forming region 142. In an implementation, the contact layer 170 may have an inverted L-shaped vertical cross-section. In an implementation, the contact layer 170 may include, e.g., Ti, TiN, Ta, TaN, W, WN, TiSiN, WSiN, polysilicon, or a combination thereof.

As shown in FIG. 4, the contact forming region 142 may be between the contact layer 170 and the channel layer 140 so that the contact layer 170 does not directly contact the channel layer 140.

An insulating liner 182A and a first insulating layer 182B may be located between two word lines WL in each of the plurality of mold openings 130H, and a second insulating layer 184 may be on the two word lines WL. In an implementation, third insulating layers 186 may be on both side walls of the contact layer 170. In an implementation, the insulating liner 182A may include silicon nitride, and the first insulating layer 182B may include silicon oxide. Each of the second insulating layer 184 and the third insulating layer 186 may include silicon nitride.

An etch stop film 188 may be on the contact layer 170 and the third insulating layer 186. The etch stop film 188 may include an opening 188H, and a top surface of the contact layer 170 may be exposed at the bottom of the opening 188H.

A capacitor structure 190 may be on the etch stop film 188. The capacitor structure 190 may include a lower electrode 192, a capacitor dielectric layer 194, and an upper electrode 196. A side wall of a bottom portion of the lower electrode 192 may be in the opening 188H of the etch stop film 188, and the lower electrode 192 may extend in the vertical direction Z. The capacitor dielectric layer 194 may be on a side wall of the lower electrode 192, and the upper electrode 196 may cover the lower electrode 192 on the capacitor dielectric layer 194.

A cell transistor of a DRAM device may have a buried channel array transistor (BCAT) structure using a portion of a silicon substrate as a channel region. As the degree of integration of the DRAM device increases, a size of the cell transistor may be reduced, thereby increasing leakage current from the channel region of the cell transistor.

In an implementation, a channel layer may be formed by using an oxide semiconductor material such as indium gallium zinc oxide, and thus, leakage current may be significantly reduced. Also, the contact forming region 142 may be formed by using a surface treatment process on a side wall and a top surface of the channel layer 140 facing the contact layer 170, and through controlled removal of zinc atoms in the surface treatment process, the contact forming region 142 may have a reduced resistivity compared to the channel layer 140. Accordingly, the semiconductor apparatus 100 may have reduced leakage current and reduced contact resistance, and may have excellent electrical characteristics.

Figure 6:
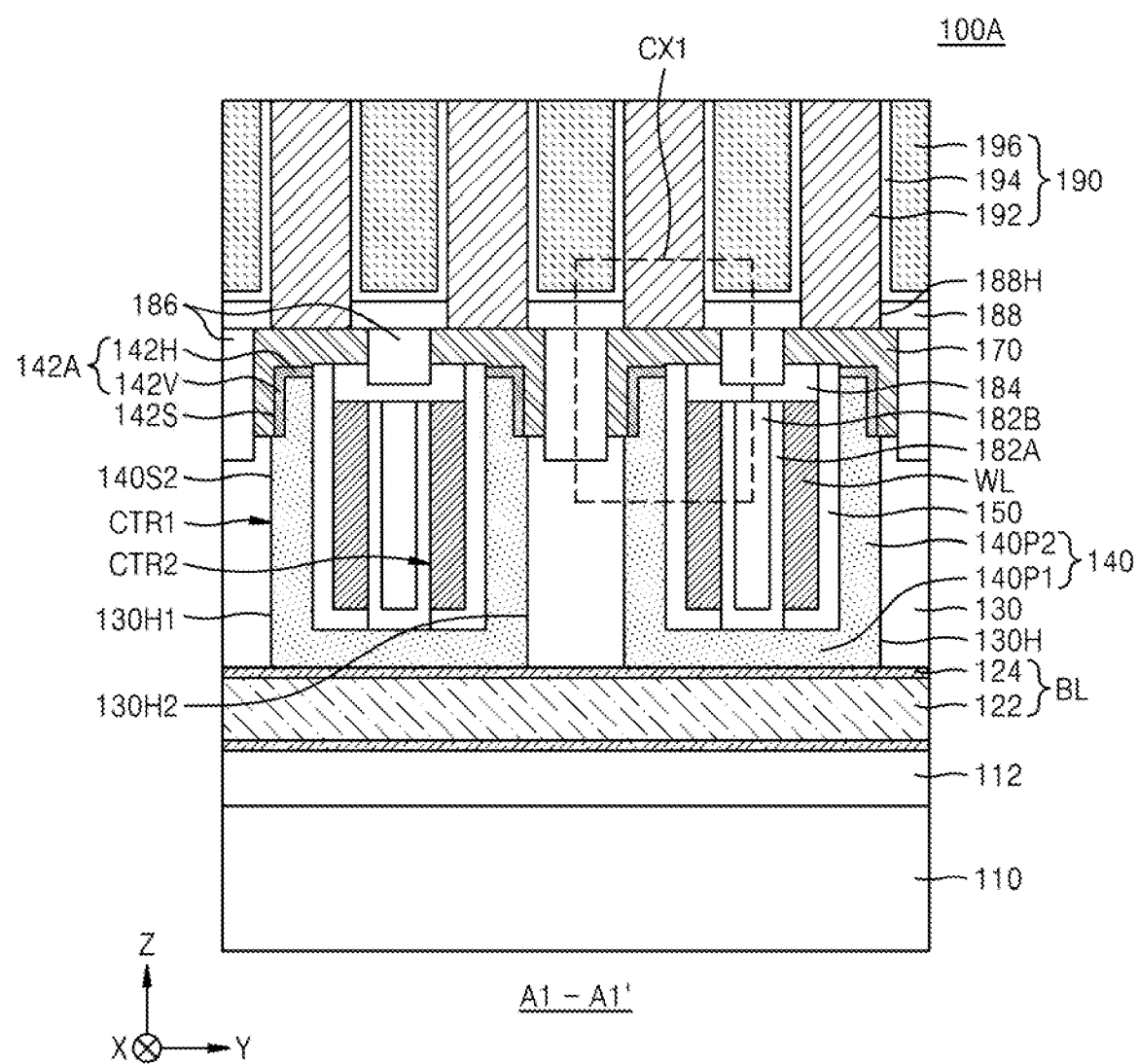
FIG. 6 is a cross-sectional view of a semiconductor apparatus, according to embodiments.
Figure 7:
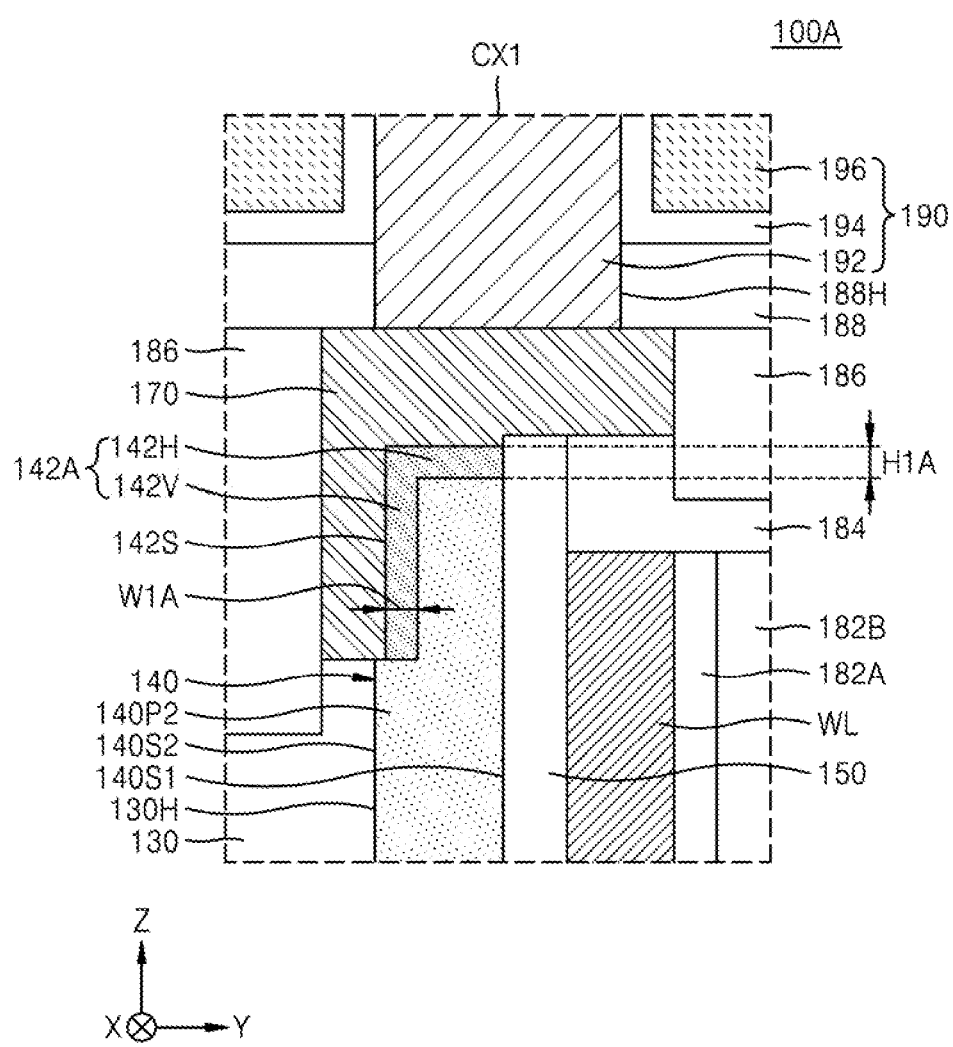
FIG. 7 is an enlarged view of the portion CX1 of FIG. 6.

FIG. 6 is a cross-sectional view of a semiconductor apparatus 100A, according to embodiments. FIG. 7 is an enlarged view of the portion CX1 of FIG. 6.

Referring to FIGS. 6 and 7, the side wall 142S of the vertical extending portion 142V of a contact forming region 142A may be recessed inwardly with respect to the second side wall 140S2 of the (e.g., lower portion of the) channel layer 140. In an implementation, a top surface of the horizontal extending portion 142H may be at a lower level than a top surface of the gate insulating layer 150 adjacent to the horizontal extending portion 142H.

In an implementation, the contact forming region 142A may be formed by performing surface treatment on a top surface of the channel layer 140 and an exposed surface of the second side wall 140S2. Due to the surface treatment, some atoms (e.g., zinc atoms) may be removed from a portion having a certain depth from the top surface of the channel layer 140 and the second side wall 140S2, and the contact forming region 142A may include a second oxide semiconductor material having an atomic ratio or stoichiometry different from that of a first oxide semiconductor material included in the channel layer 140.

During the surface treatment, portions of the contact forming region 142A may be removed by a certain depth (e.g., a thickness of 10 angstroms or less), and thus, the side wall 142S of the contact forming region 142A may be recessed inwardly with respect to the channel layer 140.

The horizontal extending portion 142H of the contact forming region 142A may have a first height H1A in the vertical direction Z, and the vertical extending portion 142V of the contact forming region 142A may have a first width W1A in the second horizontal direction Y. In an implementation, each of the first height H1A and the first width W1A may range from, e.g., about 1 angstrom to about 20 angstroms. In an implementation, the first height H1A may range from, e.g., 80% to 120% of the first width W1A.

Figure 8:
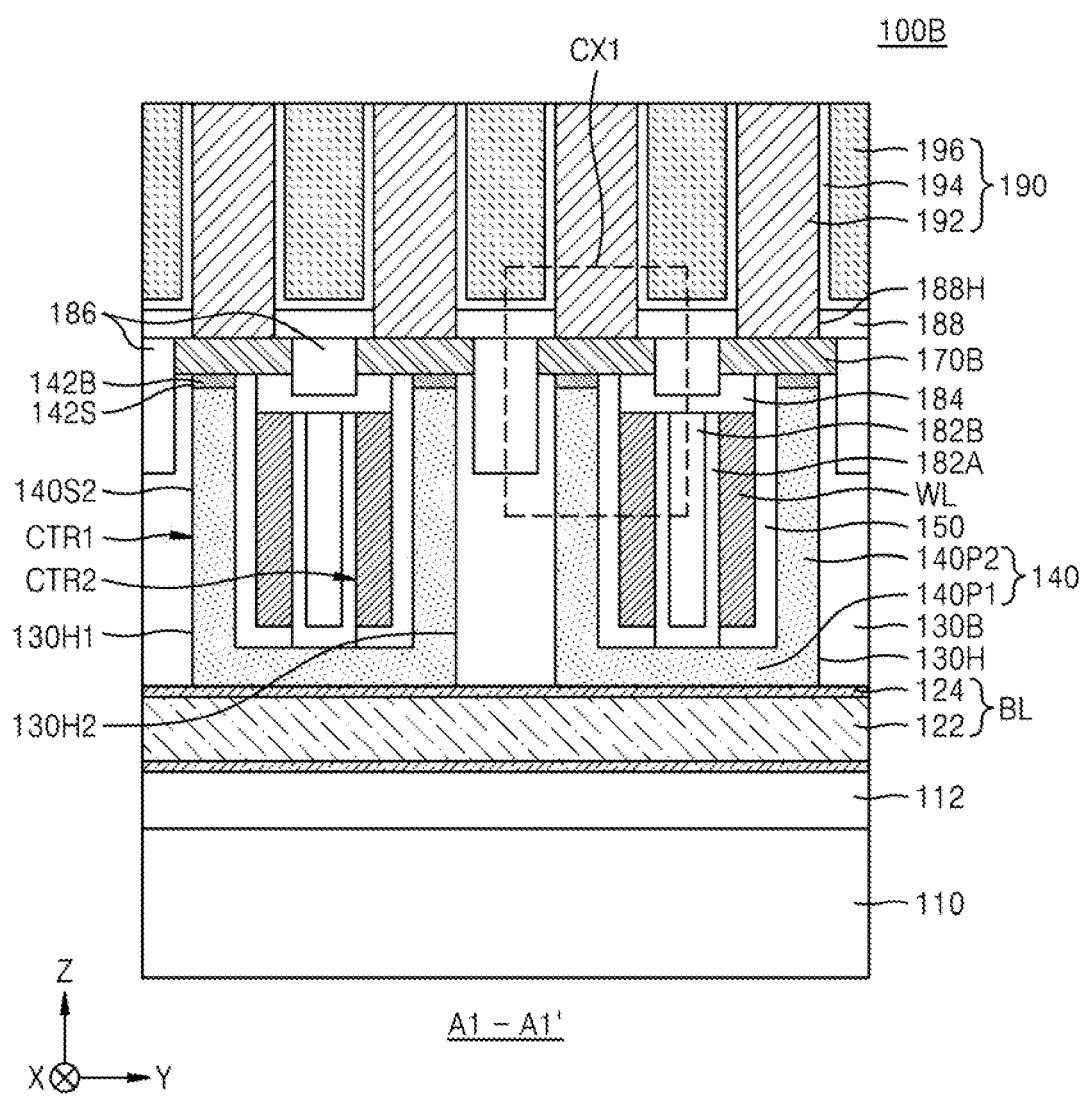
FIG. 8 is a cross-sectional view of a semiconductor apparatus, according to embodiments.
Figure 9:
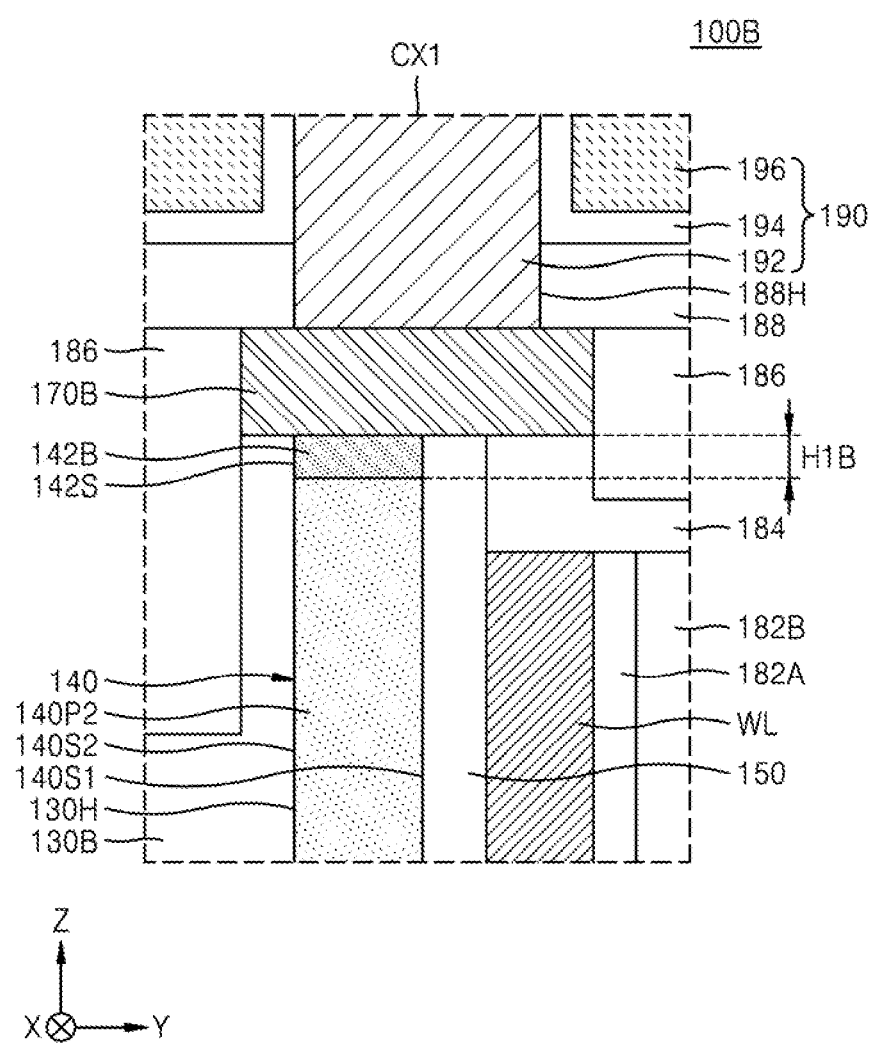
FIG. 9 is an enlarged view of the portion CX1 of FIG. 8.

FIG. 8 is a cross-sectional view of a semiconductor apparatus 100B, according to embodiments. FIG. 9 is an enlarged view of the portion CX1 of FIG. 8.

Referring to FIGS. 8 and 9, substantially the entire second side wall 140S2 of the channel layer 140 may be surrounded by a mold layer 130B, and a contact forming region 142B may be on a top surface of the channel layer 140. Also, a contact layer 170B may cover the contact forming region 142B, and may have a flat bottom surface extending in a horizontal direction on the channel layer 140 and the mold layer 130B.

In an implementation, the contact forming region 142B may be formed by performing surface treatment on the top surface of the channel layer 140. Only the top surface of the channel layer 140 may be exposed in a state where the mold layer 130B surrounds the entire second side wall 140S2 of the channel layer 140, and some atoms (e.g., zinc atoms) may be removed from a portion having a certain depth from the top surface of the channel layer 140 due to the surface treatment onto the top surface of the channel layer 140. As a result of the surface treatment, the contact forming region 142B may include a second oxide semiconductor material have an atomic ratio or stoichiometry different from that of a first oxide semiconductor material included in the channel layer 140.

The contact forming region 142B may have a first height H1B in the vertical direction Z. In an implementation, the first height H1B may range from, e.g., about 1 angstrom to about 20 angstroms.

FIGS. 10 through 20 are cross-sectional views of stages in a method of manufacturing the semiconductor apparatus 100, according to embodiments. In FIGS. 10 through 20, the same reference numerals as those in FIGS. 1 through 9 denote the same elements.

Figure 10:
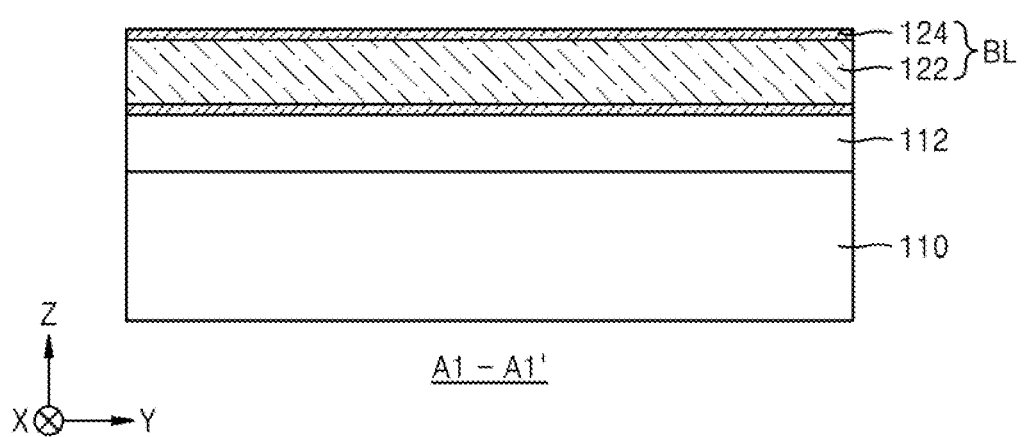
FIGS. 10 through 20 are cross-sectional views of stages in a method of manufacturing a semiconductor apparatus, according to embodiments.

Referring to FIG. 10, the lower insulating layer 112 may be formed on the substrate 110. Next, the plurality of bit lines BL extending in the second horizontal direction Y and a bit line insulating layer filling a space between the plurality of bit lines BL may be formed on the lower insulating layer 112.

In an implementation, each of the plurality of bit lines BL may include the conductive barrier layer 124, the conductive layer 122, and the conductive barrier layer 124 which are sequentially located. In an implementation, the bit line insulating layer may be formed on the lower insulating layer 112, a bit line forming space may be formed by patterning the bit line insulating layer by using a mask pattern, and the conductive barrier layer 124, the conductive layer 122, and the conductive barrier layer 124 may be sequentially formed in the bit line forming space. Next, the plurality of bit lines BL may be formed by removing upper portions of the conductive barrier layer 124, the conductive layer 122, and the conductive barrier layer 124 until a top surface of the bit line insulating layer is exposed.

Figure 11:
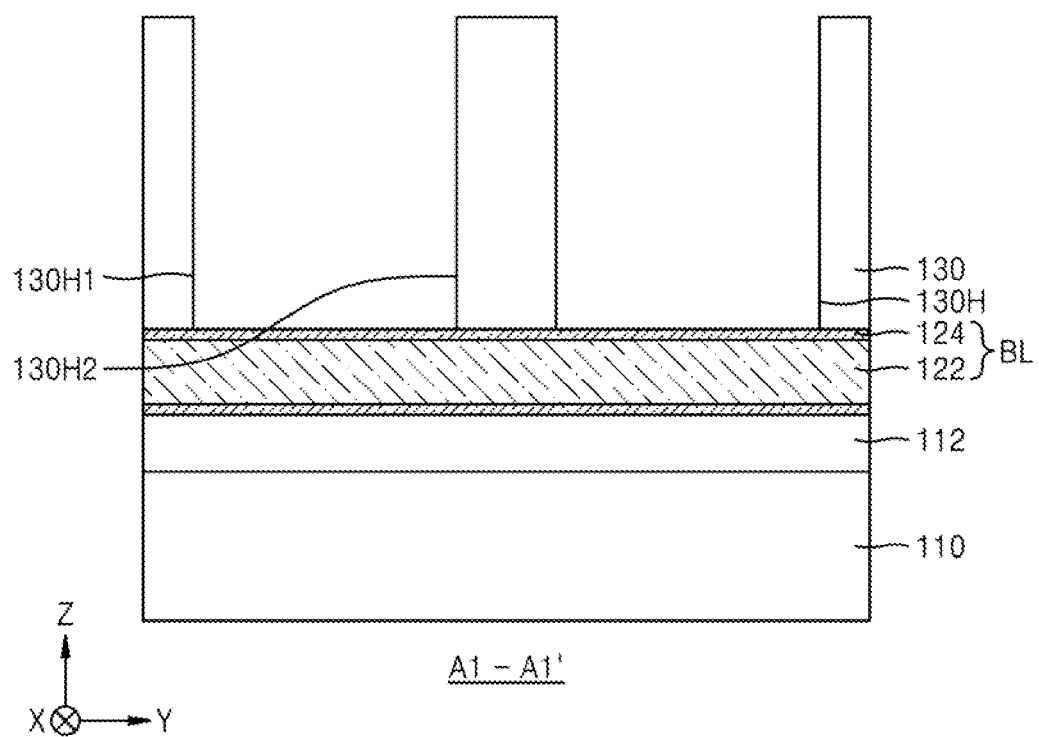

Referring to FIG. 11, the mold layer 130 may be formed on the plurality of bit lines BL and the bit line insulating layer. The mold layer 130 may be formed to have a relatively large height in the vertical direction Z by using, e.g., silicon oxide, silicon nitride, or silicon oxynitride.

Next, a mask pattern may be formed on the mold layer 130, and the plurality of mold openings 130H may be formed by using the mask pattern as an etch mask. A top surface of the bit line BL may be exposed at the bottom of the plurality of mold openings 130H. The plurality of mold openings 130H may include a first side wall 130H1 and a second side wall 130H2 opposite to each other.

Figure 12:
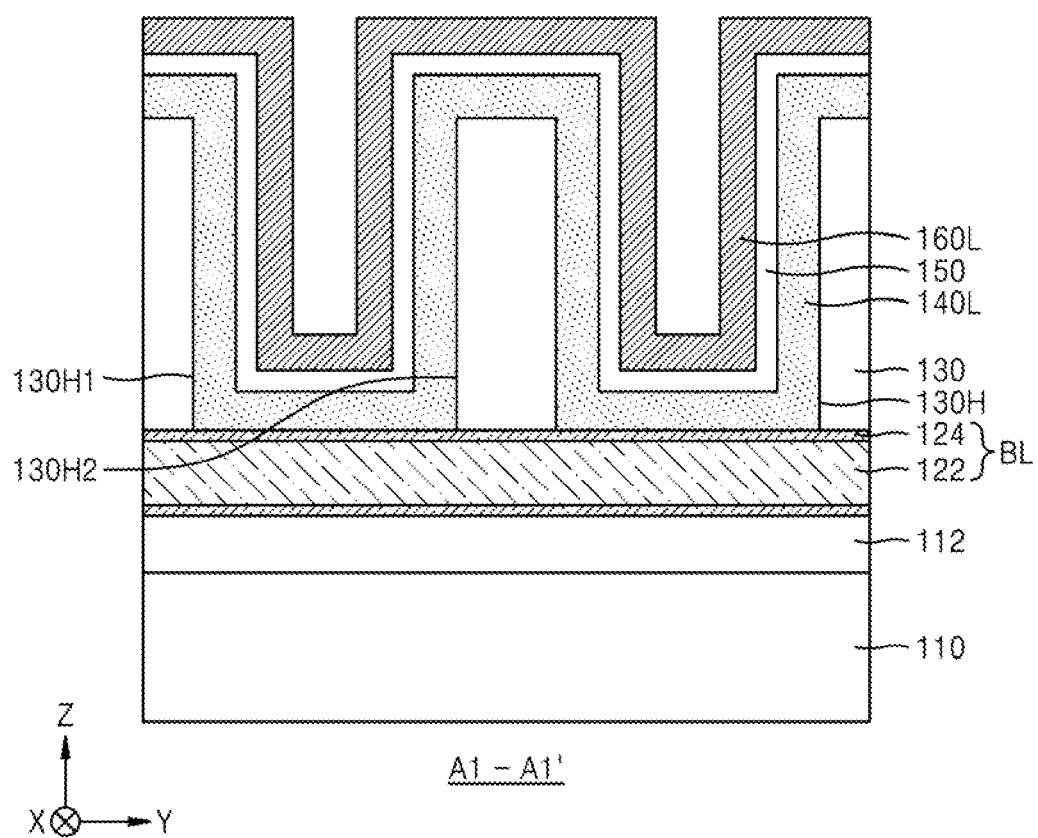

Referring to FIG. 12, a preliminary channel layer 140L may be formed on the mold layer 130 to conformally cover an inner wall of the mold opening 130H.

In an implementation, the preliminary channel layer 140L may be formed by using a first oxide semiconductor material. In an implementation, the first oxide semiconductor material may include indium. In an implementation, the first oxide semiconductor material may include, e.g., IGZO, Sn-doped IGZO, W-doped IGZO, or IZO. The first oxide semiconductor material may have the first indium content C_In1 (see FIG. 5A) and the first zinc content C_Zn1 (see FIG. 5B).

In an implementation, the preliminary channel layer 140L may be formed by using, e.g., chemical vapor deposition (CVD), low pressure CVD, plasma enhanced CVD, metal organic CVD (MOCVD), or atomic layer deposition.

Next, a gate insulating layer 150 and a gate electrode layer 160L may be sequentially formed on the preliminary channel layer 140L.

The gate insulating layer 150 may be formed of, e.g., a high-k dielectric material (having a higher dielectric constant than that of silicon oxide) or a ferroelectric material. In an implementation, the gate insulating layer 150 may be formed of, e.g., HfO, HfSiO, HfON, HfSiON, LaO, LaAlO, ZrO, ZrSiO, ZrON, ZrSiON, TaO, TiO, BaSrTiO, BaTiO, PZT, STB, BFO, SrTiO, YO, AlO, or PbScTaO.

In an implementation, the gate electrode layer 160L may be formed by using Ti, TiN, Ta, TaN, W, WN, TiSiN, WSiN, polysilicon, or a combination thereof.

Figure 13:
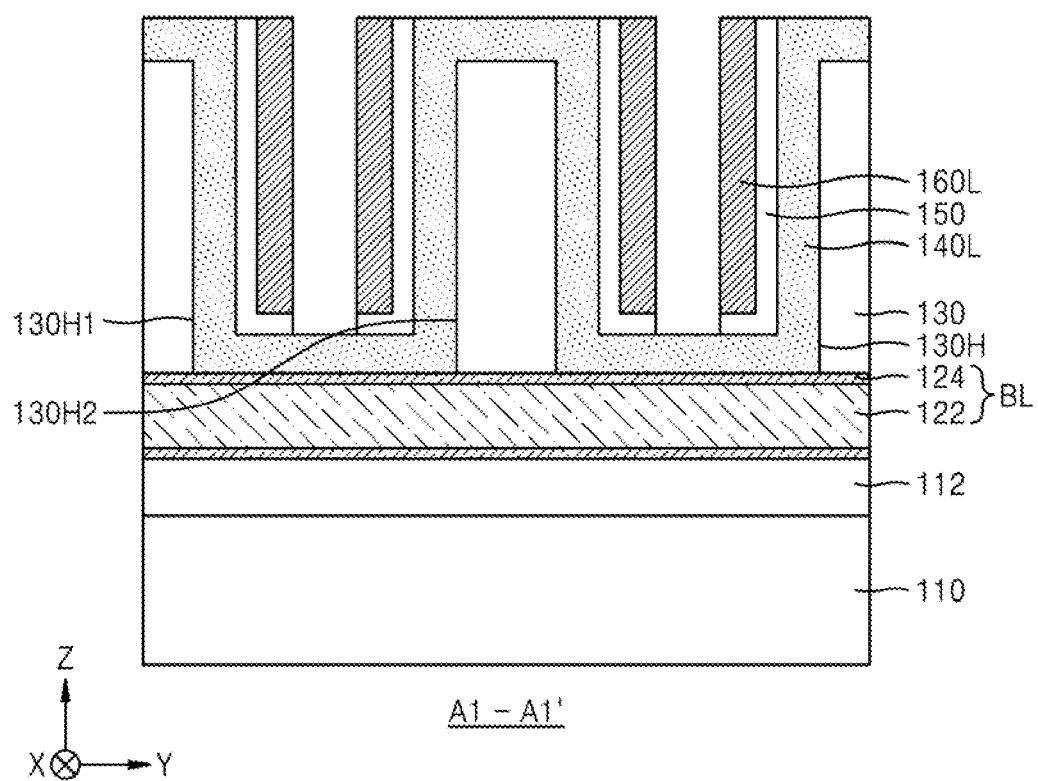

Referring to FIG. 13, an anisotropic etching process may be performed on the gate electrode layer 160L, so that a portion of the gate electrode layer 160L on the bottom of the mold opening 130H is removed and the gate electrode layer 160L is left on the first side wall 130H1 and the second side wall 130H2 of the mold opening 130H. Due to the anisotropic etching process, a portion of the gate electrode layer 160L on a top surface of the mold layer 130 may also be removed.

In an implementation, the gate electrode layer 160L may be separated into two word lines WL respectively located on the first side wall 130H1 and the second side wall 130H2 of each of the plurality of mold openings 130H.

A portion of the gate insulating layer 150 on the bottom of the mold opening 130H may also be removed by the anisotropic etching process, and thus, a top surface of the preliminary channel layer 140L may be exposed at the bottom of the mold opening 130H. Also, due to the anisotropic etching process, a portion of the gate insulating layer 150 on the top surface of the mold layer 130 may be removed and the top surface of the preliminary channel layer 140L may be exposed.

Figure 14:
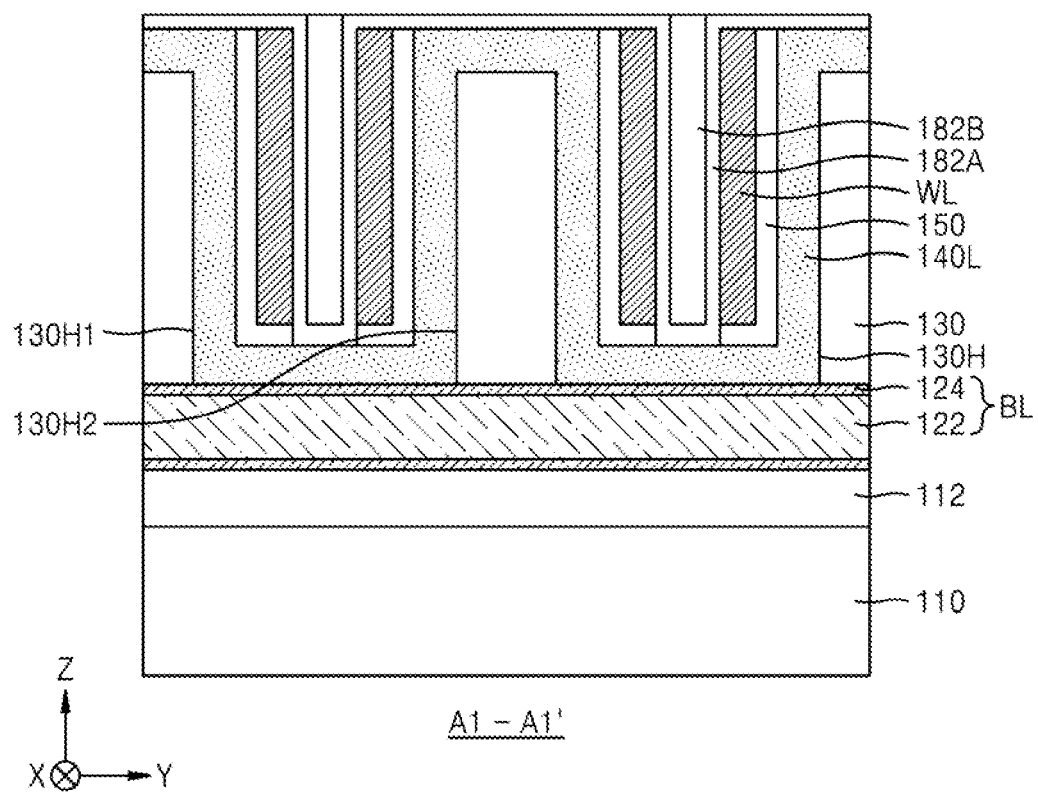

Referring to FIG. 14, the insulating liner 182A and the first insulating layer 182B may be formed in the mold opening 130H. The insulating liner 182A and the first insulating layer 182B may be between two adjacent word lines WL, and the insulating liner 182A may be on the top surface of the preliminary channel layer 140L.

Figure 15:
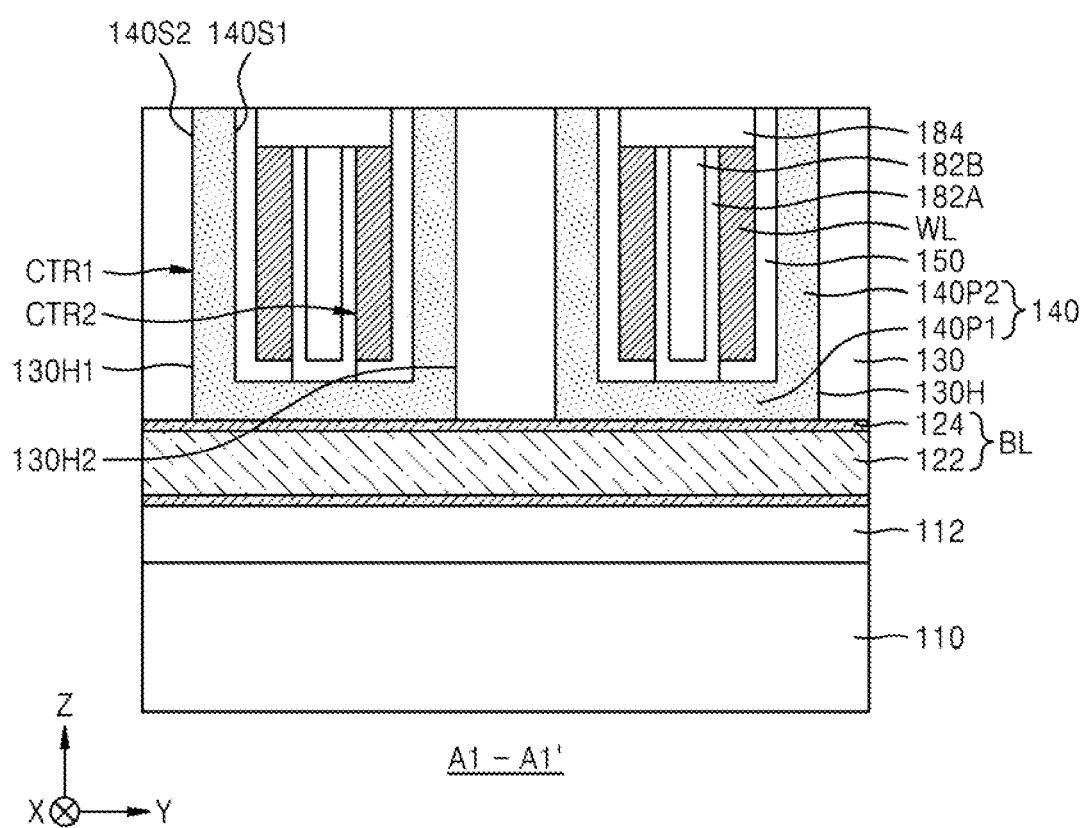

Referring to FIG. 15, portions of the insulating liner 182A and the preliminary channel layer 140L on the top surface of the mold layer 130 may be removed by an etch-back process or a planarization process, so that the channel layer 140 remains in the mold opening 130H.

Due to the etch-back process or the planarization process, the channel layer 140 having a U-shaped vertical cross-section may be formed in the mold opening 130H. Also, as a portion of the preliminary channel layer 140L on the top surface of the mold layer 130 is removed, the top surface of the mold layer 130 may be exposed.

In an implementation, the channel layer 140 may include the first portion 140P1 extending in the second horizontal direction Y, and the second portions 140P2 connected to both ends of the first portion 140P1 and extending in the vertical direction Z. The first side wall 140S1 of the second portion 140P2 may be surrounded by, face, or contact the gate insulating layer 150, and the second side wall 140S2 of the second portion 140P2 may be surrounded by, face, or contact the mold layer 130. In an implementation, a top surface of the channel layer 140 may be at the same level as the top surface of the mold layer 130.

Next, a part of an upper portion of the word line WL in the mold opening 130H may be removed by an etch-back process. In the etch-back process, a part of an upper portion of the insulating liner 182A and a part of an upper portion of the first insulating layer 182B may also be removed.

Next, the second insulating layer 184 filling an inlet of the mold opening 130H may be formed. The second insulating layer 184 having a flat bottom surface may be on top surfaces of the word line WL, the insulating liner 182A, and the first insulating layer 182B.

Accordingly, the first cell transistor CTR1 and the second cell transistor CTR2 may be formed in the mold opening 130H. The first cell transistor CTR1 and the second cell transistor CTR2 may be mirror symmetric to each other.

Figure 16:
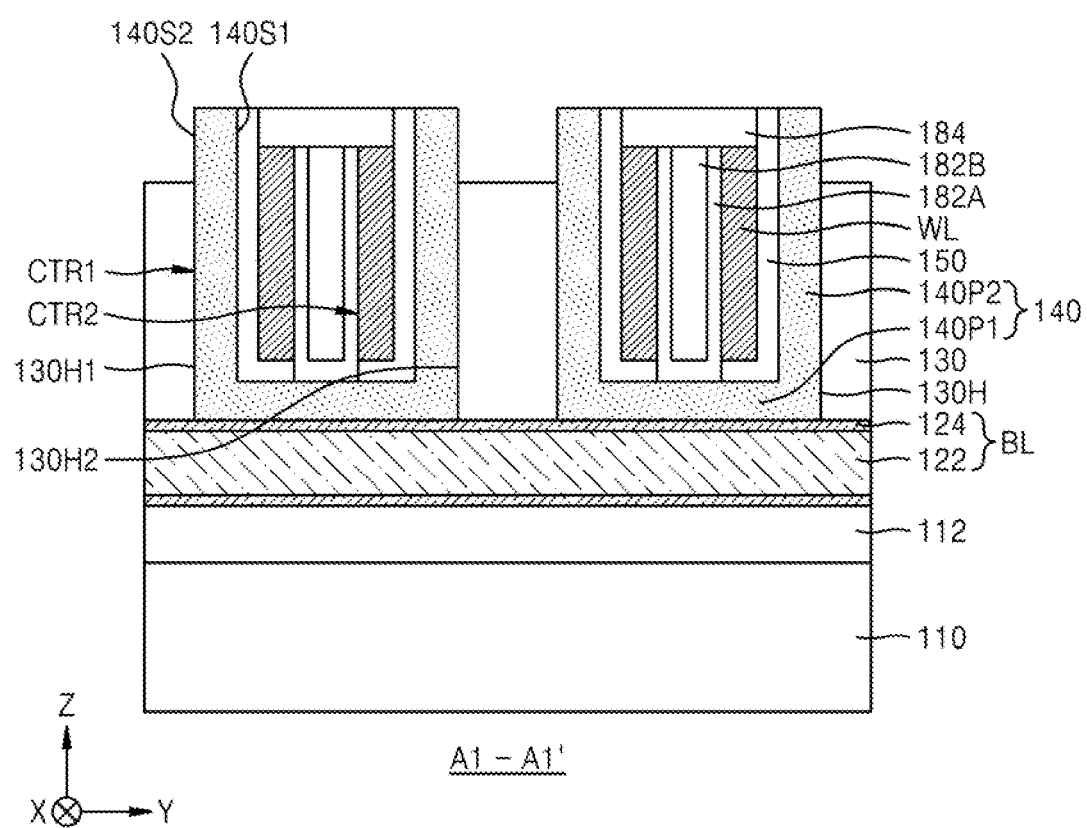

Referring to FIG. 16, a part of an upper portion of the mold layer 130 may be removed by performing a recess process on the top surface of the mold layer 130. As a result of the recess process, the top surface of the mold layer 130 may be at a lower level than the top surface of the channel layer 140 and a top surface of the second insulating layer 184, and an upper portion of the second side wall 140S2 of the channel layer 140 may be exposed to the outside of the mold layer 130.

Figure 17:
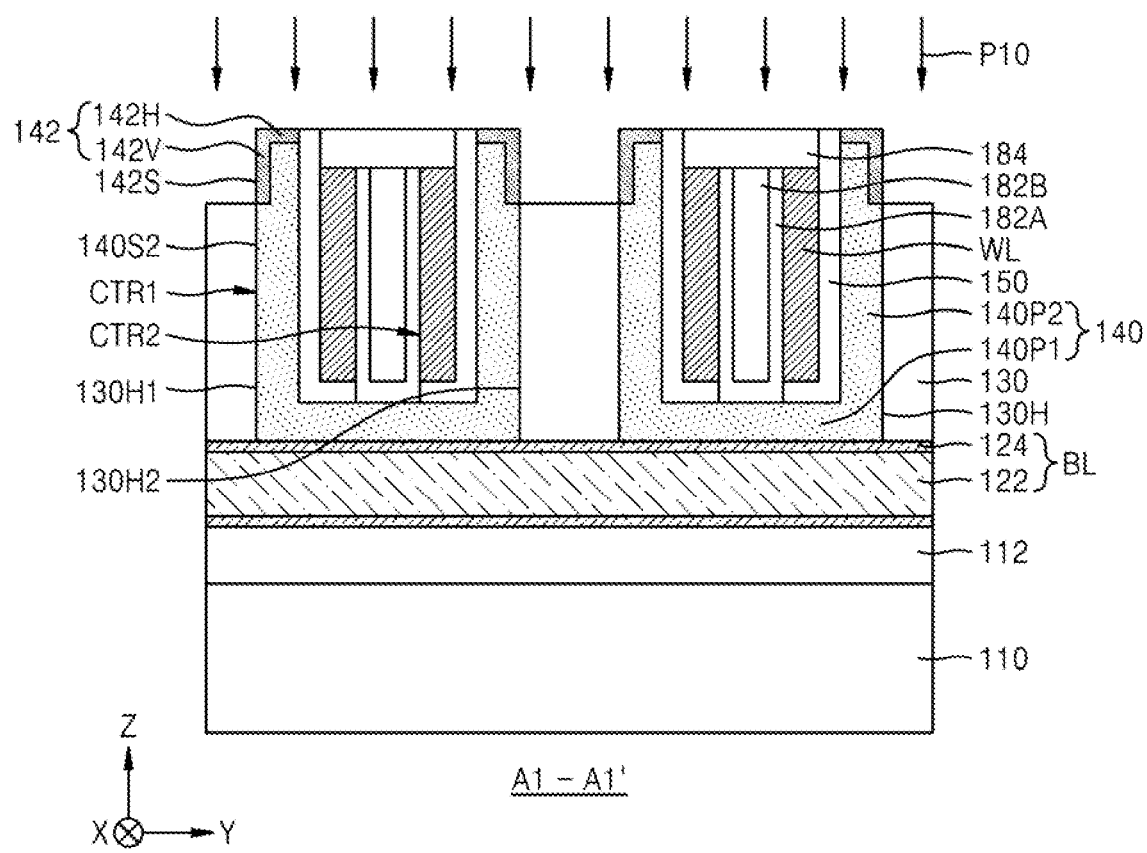

Referring to FIG. 17, the contact forming region 142 may be formed by performing a surface treatment process P10 on the second side wall 140S2 and the top surface of the exposed channel layer 140.

In an implementation, the surface treatment process P10 may include immersing the exposed surface of the channel layer 140 in a surface treatment solution for a first treatment period. In an implementation, the first treatment period may range from, e.g., 20 seconds to 150 seconds.

In an implementation, the surface treatment solution may be a mixed solution of ammonium hydroxide ($NH_4OH$), hydrogen peroxide ($H_2O_2$), and water ($H_2O$). In an implementation, ammonium hydroxide ($NH_4OH$):hydrogen peroxide ($H_2O_2$):water ($H_2O$) may be included in the surface treatment solution at a (e.g., volume) ratio of 1:1~20:5~100. The surface treatment process P10 using the surface treatment solution may be performed at a temperature of 20° C. to 90° C.

In an implementation, the surface treatment solution may include a mixed solution of, e.g., hydrogen peroxide ($H_2O_2$) and water ($H_2O$). In an implementation, hydrogen peroxide ($H_2O_2$):water ($H_2O$) may be included in the surface treatment solution at a (e.g., volume) ratio of 1:0.01~10. The surface treatment process P10 using the surface treatment solution may be performed at a temperature of 20° C. to 90° C.

During the surface treatment process P10, specific atoms (e.g., zinc) may be selectively removed from a region located within a certain thickness or depth from a surface of the channel layer 140. In an implementation, during the surface treatment process P10, zinc atoms may be removed at a higher rate than indium atoms from the surface of the channel layer 140. The region where the specific atoms are selectively removed from the channel layer 140 may be an indium-rich region having a relatively high indium content, and the indium-rich region may be referred to as the contact forming region 142.

In an implementation, the channel layer 140 may include a first oxide semiconductor material, and may have the first indium content C_In1 (see FIG. 5A) and the first zinc content C_Zn1 (see FIG. 5B), and the contact forming region 142 may include a second oxide semiconductor material, and may have the second indium content C_In2 (see FIG. 5A) and the second zinc content C_Zn2 (see FIG. 5B). The second indium content C_In2 may be greater than the first indium content C_In1, and the second zinc content C_Zn2 may be less than the first zinc content C_Zn1.

The contact forming region 142 may include the horizontal extending portion 142H extending in the second horizontal direction Y and the vertical extending portion 142V extending in the vertical direction Z, and may be at a higher vertical level than the top surface of the mold layer 130. The contact forming region 142 may have an inverted L-shaped vertical cross-section.

The surface treatment process P10 may not substantially affect an atomic ratio or stoichiometry of the first oxide semiconductor material included in the channel layer 140, and may not substantially damage the second insulating layer 184 and the mold layer 130 exposed to the surface treatment solution during the surface treatment process P10. Accordingly, the surface treatment process P10 may selectively remove only specific atoms (e.g., zinc), and a separate additional process may not be required after the surface treatment process P10.

Also, during the surface treatment process P10, the side wall 142S of the contact forming region 142 may be aligned with the second side wall 140S2 of the channel layer 140 (or the side wall 142S of the contact forming region 142 may be coplanar with the second side wall 140S2 of the channel layer 140), without removing a side wall of the contact forming region 142.

Figure 18:
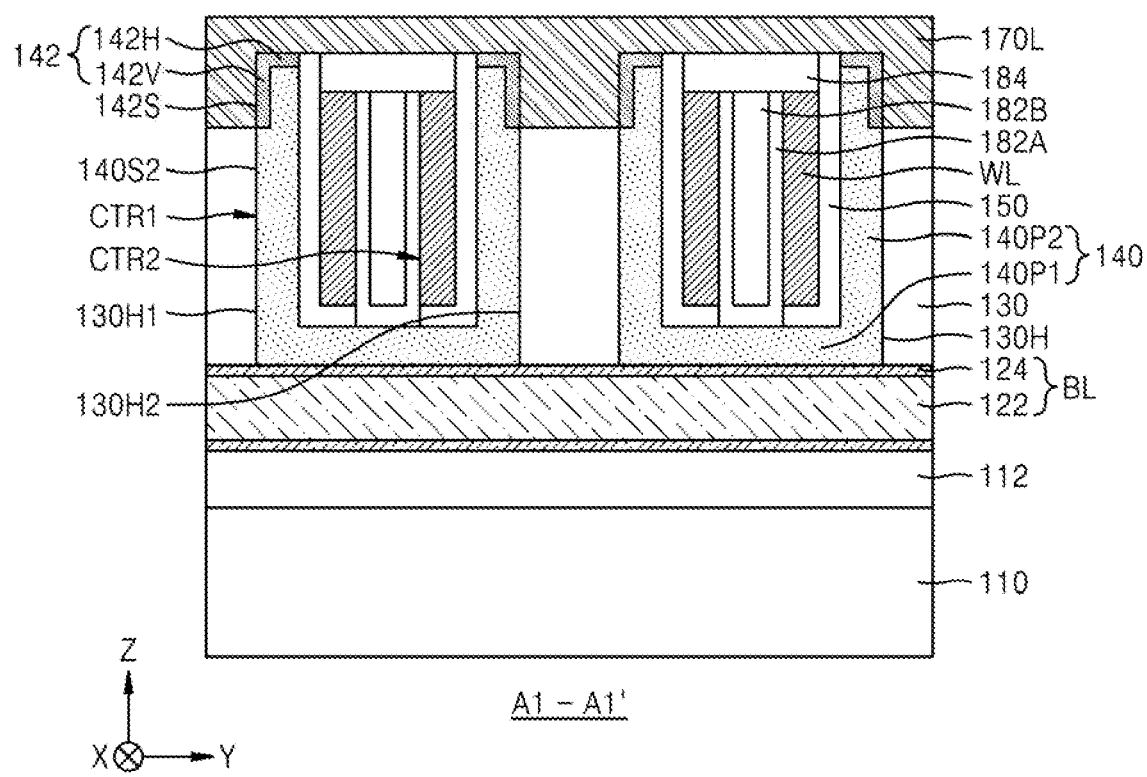

Referring to FIG. 18, a contact conductive layer 170L may be formed on the contact forming region 142, the mold layer 130, and the second insulating layer 184.

In an implementation, the contact conductive layer 170L may include Ti, TiN, Ta, TaN, W, WN, TiSiN, WSiN, polysilicon, or a combination thereof.

Figure 19:
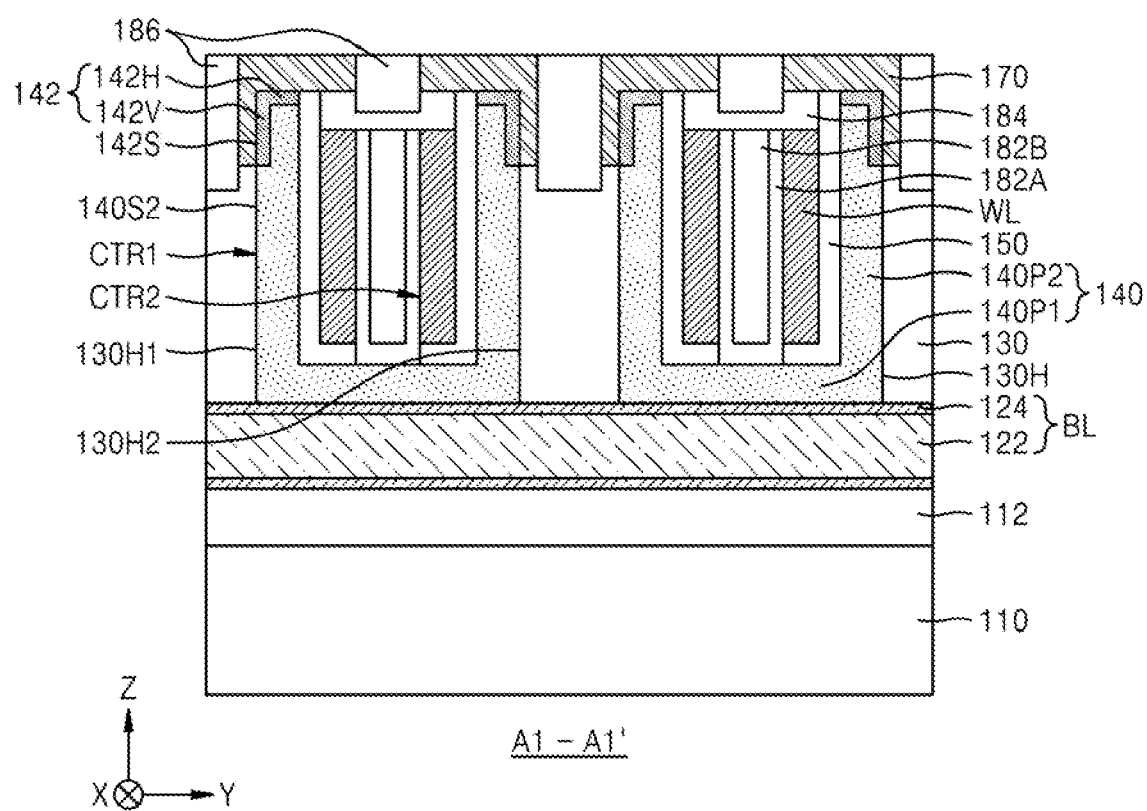

Referring to FIG. 19, a mask pattern may be formed on the contact conductive layer 170L, the contact layer 170 may be formed by removing a portion of the contact conductive layer 170L by using the mask pattern, and the third insulating layer 186 may be formed in an area where the contact conductive layer 170L is removed.

In an implementation, the third insulating layer 186 may be formed of silicon nitride. In an implementation, a side wall of the contact layer 170 may be surrounded by the third insulating layer 186, and a bottom surface of the contact layer 170 may extend to the mold layer 130 while covering the side wall 142S and a top surface of the contact forming region 142.

Figure 20:
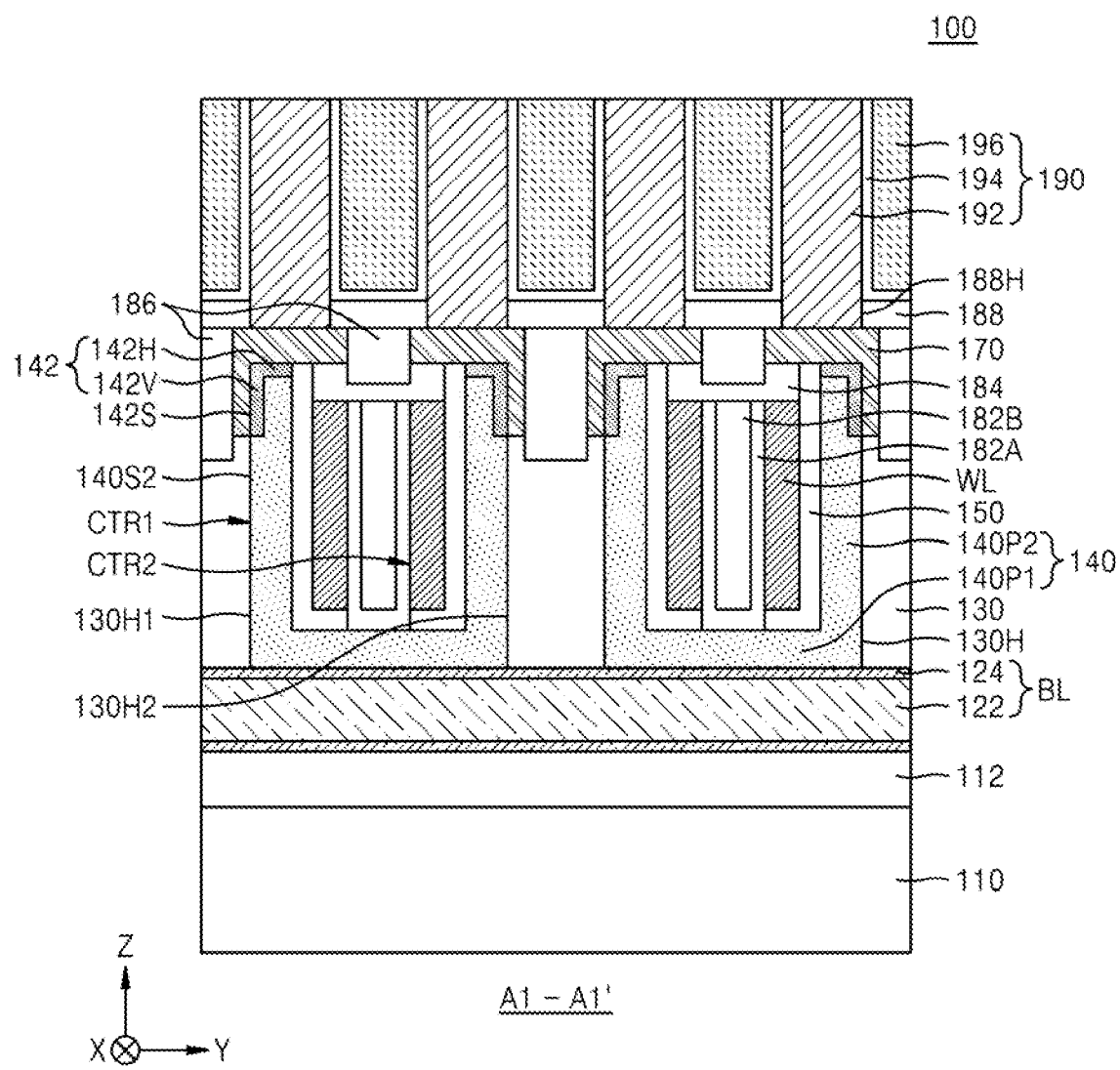

Referring to FIG. 20, the etch stop film 188 may be formed on the contact layer 170 and the third insulating layer 186. The etch stop film 188 may include the opening 188H, and a top surface of the contact layer 170 may be exposed at the bottom of the opening 188H.

Next, the lower electrode 192, the capacitor dielectric layer 194, and the upper electrode 196 may be sequentially formed on the etch stop film 188.

The semiconductor apparatus 100 may be completed by performing the above process.

According to embodiments, after a recess process of the mold layer 130 is performed, the surface treatment process P10 using a surface treatment solution may be performed on the second side wall 140S2 and an exposed top surface of the channel layer 140. As a result of the surface treatment process P10, specific atoms (e.g., zinc) may be selectively removed from the channel layer 140, and thus, the contact forming region 142 may be formed. The contact forming region 142 may have a zinc content less than that of the channel layer 140, may have an indium content greater than that of the channel layer 140, and may have a resistivity lower than that of the channel layer 140. Accordingly, the semiconductor apparatus 100 may have reduced leakage current and reduced contact resistance.

In an implementation, the side wall 142S of the contact forming region 142 and the second side wall 140S2 of the channel layer 140 may be aligned with each other (or coplanar with each other) without removing a side wall of the contact forming region 142 during the surface treatment process P10 in FIG. 17. In an implementation, the side wall 142S of the contact forming region 142 may be removed by a certain thickness. In an implementation, the side wall 142S of the contact forming region 142 may be recessed inwardly with respect to the second side wall 140S2 of the channel layer 140, and the semiconductor apparatus 100A described with reference to FIGS. 6 and 7 may be manufactured.

In an implementation, the second side wall 140S2 of the channel layer 140 may be exposed to the outside of the mold layer 130 by performing a recess process of the mold layer 130 in FIG. 16. In an implementation, the entire second side wall 140S2 of the channel layer 140 may be surrounded by the mold layer 130 without performing a recess process of the mold layer 130. In this case, the surface treatment process P10 described with reference to FIG. 17 may be performed in a state where only a top surface of the channel layer 140 is exposed, and the semiconductor apparatus 100B described with reference to FIGS. 8 and 9 may be manufactured.

By way of summation and review, in a DRAM device having a 1T-1C structure in which one capacitor is connected to one transistor, leakage current through a channel region could increase as a size of a device decreases. In order to reduce leakage current, a transistor may use an oxide semiconductor material as a channel layer.

One or more embodiments may provide a semiconductor apparatus including a capacitor structure.

One or more embodiments may provide a semiconductor apparatus in which leakage current may be reduced and contact resistance may be reduced.

One or more embodiments may provide a method of manufacturing a semiconductor apparatus in which leakage current may be reduced and contact resistance may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor apparatus, comprising:
    a bit line extending in a first horizontal direction on a substrate;
    a channel layer on the bit line, the channel layer extending in a vertical direction, including a first oxide semiconductor material that includes indium, and having a first side wall and a second side wall;
    a word line on the first side wall of the channel layer;
    a contact forming region on a top surface and an upper portion of the second side wall of the channel layer, the contact forming region including a second oxide semiconductor material that includes indium and having a resistivity lower than a resistivity of the channel layer;
    a contact layer on the contact forming region; and
    a capacitor structure on a top surface of the contact layer.

2. The semiconductor apparatus as claimed in claim 1, wherein:
    the first oxide semiconductor material includes InGaZnO$_x$ (IGZO), Sn-doped IGZO, W-doped IGZO, or InZnO$_x$ (IZO), and the second oxide semiconductor material includes IGZO, Sn-doped IGZO, W-doped IGZO, or IZO.

3. The semiconductor apparatus as claimed in claim 2, wherein:
the channel layer has a first indium content, and
the contact forming region has a second indium content greater than the first indium content.

4. The semiconductor apparatus as claimed in claim 2, wherein:
the channel layer has a first zinc content, and
the contact forming region has a second zinc content less than the first zinc content.

5. The semiconductor apparatus as claimed in claim 1, wherein the contact forming region includes:
a horizontal extending portion on the top surface of the second side wall of the channel layer, and
a vertical extending portion on the upper portion of the second side wall of the channel layer.

6. The semiconductor apparatus as claimed in claim 5, further comprising a mold layer surrounding the second side wall of the channel layer,
wherein the vertical extending portion and the horizontal extending portion of the contact forming region are at a higher vertical level than a top surface of the mold layer.

7. The semiconductor apparatus as claimed in claim 6, wherein:
a side wall of the vertical extending portion of the contact forming region is aligned with the second side wall of the channel layer, and
the side wall of the vertical extending portion is not surrounded by the mold layer.

8. The semiconductor apparatus as claimed in claim 6, wherein:
the contact layer covers a side wall of the vertical extending portion and a top surface of the horizontal extending portion of the contact forming region, and
the contact layer contacts the top surface of the mold layer.

9. The semiconductor apparatus as claimed in claim 6, wherein a side wall of the vertical extending portion of the contact forming region is recessed inwardly with respect to the second side wall of the channel layer.

10. The semiconductor apparatus as claimed in claim 6, wherein:
the horizontal extending portion of the contact forming region has a first height in the vertical direction,
the vertical extending portion of the contact forming region has a first width in the first horizontal direction, and
the first height ranges from 80% to 120% of the first width.

11. A semiconductor apparatus, comprising:
a bit line extending in a first horizontal direction on a substrate;
a channel layer on the bit line, the channel layer extending in a vertical direction, including a first oxide semiconductor material that includes indium, and having a first side wall and a second side wall;
a word line on the first side wall of the channel layer;
a contact forming region on a top surface of the channel layer, the contact forming region including a second oxide semiconductor material that includes indium;
a contact layer on the contact forming region; and
a capacitor structure on the contact layer,
wherein:
the channel layer has a first indium content, and
the contact forming region has a second indium content greater than the first indium content.

12. The semiconductor apparatus as claimed in claim 11, wherein:
the first oxide semiconductor material includes InGaZnO$_x$ (IGZO), Sn-doped IGZO, W-doped IGZO, or InZnO$_x$ (IZO), and
the second oxide semiconductor material includes IGZO, Sn-doped IGZO, W-doped IGZO, or IZO.

13. The semiconductor apparatus as claimed in claim 12, wherein:
the channel layer has a first zinc content, and
the contact forming region has a second zinc content less than the first zinc content.

14. The semiconductor apparatus as claimed in claim 11, wherein the contact forming region includes:
a horizontal extending portion on the top surface of the channel layer, and
a vertical extending portion connected to the horizontal extending portion, the vertical extending portion being on an upper portion of the second side wall of the channel layer.

15. The semiconductor apparatus as claimed in claim 14, further comprising a mold layer surrounding the second side wall of the channel layer,
wherein:
a side wall of the vertical extending portion of the contact forming region is aligned with the second side wall of the channel layer, and
the side wall of the vertical extending portion does not contact the mold layer.

16. The semiconductor apparatus as claimed in claim 15, wherein:
the contact layer covers the side wall of the vertical extending portion and a top surface of the horizontal extending portion of the contact forming region, and
the contact layer contacts a top surface of the mold layer.

17. The semiconductor apparatus as claimed in claim 14, wherein:
the vertical extending portion of the contact forming region has a first width in the first horizontal direction,
the horizontal extending portion of the contact forming region has a first height in the vertical direction, and
the first height ranges from 80% to 120% of the first width.

18. A semiconductor apparatus, comprising:
a bit line extending in a first horizontal direction on a substrate;
a mold layer covering the bit line on the substrate, the mold layer including a mold opening;
a channel layer on an inner wall of the mold opening, the channel layer extending in the first horizontal direction, including a first portion contacting a top surface of the bit line and a second portion extending in a vertical direction on the inner wall of the mold opening, and including a first oxide semiconductor material that includes indium;
a word line in the mold opening, the word line being on a first side wall of the second portion of the channel layer;
a contact forming region covering the channel layer, the contact forming region including a second oxide semiconductor material that includes indium and including a horizontal extending portion located on a top surface of the channel layer and a vertical extending portion located on an upper portion of a second side wall opposite to the first side wall of the second portion of the channel layer;

a contact layer covering the contact forming region; and a capacitor structure on the contact layer, wherein:

the channel layer has a first indium content, and the contact forming region has a second indium content greater than the first indium content.

19. The semiconductor apparatus as claimed in claim 18, wherein:

a side wall of the vertical extending portion of the contact forming region is aligned with the second side wall of the channel layer, and the side wall of the vertical extending portion does not contact the mold layer.

20. The semiconductor apparatus as claimed in claim 18, wherein the contact layer contacts a top surface of the mold layer.

* * * * *